United States Patent
Kuo et al.

(10) Patent No.: US 10,411,177 B2
(45) Date of Patent: Sep. 10, 2019

(54) LIGHT EMITTING DEVICE

(71) Applicant: EPISTAR CORPORATION, Hsinchu (TW)

(72) Inventors: De-Shan Kuo, Hsinchu (TW); Ting-Chia Ko, Hsinchu (TW); Chun-Hsiang Tu, Hsinchu (TW); Po-Shun Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/019,136

(22) Filed: Jun. 26, 2018

(65) Prior Publication Data

US 2018/0309038 A1   Oct. 25, 2018

Related U.S. Application Data

(63) Continuation of application No. 15/854,462, filed on Dec. 26, 2017, now Pat. No. 10,038,129, which is a
(Continued)

(51) Int. Cl.
  *H01L 33/62* (2010.01)
  *H01L 33/08* (2010.01)
  *H01L 33/60* (2010.01)
  *H01L 27/15* (2006.01)
  *H01L 33/30* (2010.01)
  *H01L 33/32* (2010.01)
(Continued)

(52) U.S. Cl.
  CPC .............. *H01L 33/62* (2013.01); *H01L 27/15* (2013.01); *H01L 33/06* (2013.01); *H01L 33/08* (2013.01); *H01L 33/30* (2013.01); *H01L 33/32* (2013.01); *H01L 33/42* (2013.01); *H01L 33/60* (2013.01); *H01L 27/156* (2013.01)

(58) Field of Classification Search
  CPC ....... H01L 33/60; H01L 33/08; H01L 27/156; H01L 33/62; H01L 27/15
  USPC ............ 257/13, 44, 88, 98, E33.067; 438/29
  See application file for complete search history.

(56) References Cited

U.S. PATENT DOCUMENTS 4,317,086 A * 2/1982 Scifres .................... H01L 33/44
                                                       257/40
4,984,034 A * 1/1991 Yamazaki ............. H01L 27/156
                                                       257/65
(Continued)

FOREIGN PATENT DOCUMENTS

CN       1330416 A     1/2002
CN       1993837 A     7/2007
(Continued)

*Primary Examiner* — Caleb E Henry
(74) *Attorney, Agent, or Firm* — Ditthavong & Steiner, P.C.

(57) ABSTRACT

A light-emitting device, comprising: a substrate; a semiconductor stacking layer comprising a first type semiconductor layer on the substrate, an active layer on the first semiconductor layer, and a second semiconductor layer on the active layer; and an electrode structure on the second semiconductor layer, wherein the electrode structure comprises a bonding layer, a conductive layer, and a first barrier layer between the bonding layer and the conductive layer; wherein the conductive layer has higher standard oxidation potential than that of the bonding layer.

20 Claims, 3 Drawing Sheets

Related U.S. Application Data continuation of application No. 15/357,334, filed on Nov. 21, 2016, now Pat. No. 9,893,257, which is a continuation of application No. 15/049,917, filed on Feb. 22, 2016, now Pat. No. 9,530,948, which is a continuation of application No. 13/854,212, filed on Apr. 1, 2013, now Pat. No. 9,293,656.

(60) Provisional application No. 61/721,737, filed on Nov. 2, 2012.

(51) Int. Cl.
*H01L 33/06* (2010.01)
*H01L 33/42* (2010.01)

(56) References Cited

U.S. PATENT DOCUMENTS

| | | | | |
|---|---|---|---|---|
| 5,803,579 | A * | 9/1998 | Turnbull | B60L 1/14 362/516 |
| 5,841,128 | A * | 11/1998 | Shibuya | H01L 31/167 250/208.1 |
| 5,930,279 | A * | 7/1999 | Apollonov | H01S 5/02236 257/88 |
| 6,635,901 | B2 * | 10/2003 | Sawaki | H01L 33/16 257/103 |
| 6,825,502 | B2 | 11/2004 | Okazaki et al. | |
| 6,958,498 | B2 | 10/2005 | Shelton et al. | |
| 7,135,711 | B2 * | 11/2006 | Linder | H01L 27/156 257/98 |
| 7,719,013 | B2 * | 5/2010 | Lee | H01L 25/0753 257/100 |
| 7,834,370 | B2 * | 11/2010 | Koya | H01L 33/60 257/98 |
| 8,022,419 | B2 * | 9/2011 | Yasuda | H01L 33/08 257/88 |
| 8,058,082 | B2 * | 11/2011 | Yu | H01L 33/007 438/22 |
| 8,058,663 | B2 * | 11/2011 | Fan | H01L 27/15 257/103 |
| 8,115,212 | B2 | 2/2012 | Miki et al. | |
| 8,232,120 | B2 * | 7/2012 | Seko | H01L 33/0079 257/98 |
| 8,272,757 | B1 * | 9/2012 | Fan | H01L 25/0753 257/778 |
| 8,324,639 | B2 | 12/2012 | Fudeta et al. | |
| 8,502,465 | B2 | 8/2013 | Katona et al. | |
| 8,552,455 | B2 | 10/2013 | Lee et al. | |
| 2002/0014630 | A1 | 2/2002 | Okazaki et al. | |
| 2003/0087467 | A1 * | 5/2003 | Oohata | H01L 33/22 438/47 |
| 2004/0213017 | A1 * | 10/2004 | Chou | G02B 6/0041 362/558 |
| 2004/0238834 | A1 * | 12/2004 | Yasuoka | H05K 1/0274 257/88 |
| 2005/0023550 | A1 * | 2/2005 | Eliashevich | H01L 25/0753 257/99 |
| 2005/0179044 | A1 * | 8/2005 | Oohata | H01L 25/0753 257/91 |
| 2005/0254243 | A1 * | 11/2005 | Jiang | H05B 33/0809 362/231 |
| 2005/0277218 | A1 | 12/2005 | Nakajo et al. | |
| 2006/0097270 | A1 | 5/2006 | Yuri | |
| 2006/0102912 | A1 * | 5/2006 | Abe | H01L 27/3211 257/88 |
| 2006/0175621 | A1 * | 8/2006 | Ohtsuka | H01L 27/156 257/88 |
| 2006/0180818 | A1 * | 8/2006 | Nagai | F21K 9/00 257/89 |
| 2006/0214173 | A1 * | 9/2006 | Beeson | H01L 33/20 257/88 |
| 2007/0176188 | A1 * | 8/2007 | Tanaka | H01L 33/46 257/88 |
| 2007/0190676 | A1 * | 8/2007 | Chu | H01L 33/20 438/22 |
| 2007/0215878 | A1 * | 9/2007 | Wuu | H01L 33/08 257/72 |
| 2007/0241348 | A1 | 10/2007 | Inoue et al. | |
| 2007/0246735 | A1 | 10/2007 | Yahata et al. | |
| 2007/0262323 | A1 * | 11/2007 | Sonobe | F21V 3/061 257/77 |
| 2007/0262331 | A1 | 11/2007 | Ogihara et al. | |
| 2007/0278502 | A1 * | 12/2007 | Shakuda | C09K 11/584 257/88 |
| 2008/0142814 | A1 * | 6/2008 | Chu | H01L 33/20 257/79 |
| 2008/0145961 | A1 * | 6/2008 | Horio | H01L 33/08 438/29 |
| 2008/0149945 | A1 * | 6/2008 | Nagai | F21K 9/00 257/88 |
| 2008/0149946 | A1 * | 6/2008 | Kim | H01L 33/007 257/89 |
| 2008/0157109 | A1 | 7/2008 | Hon | |
| 2008/0237622 | A1 * | 10/2008 | Choi | H01L 33/382 257/98 |
| 2008/0251796 | A1 * | 10/2008 | Lee | H01L 27/153 257/88 |
| 2008/0251808 | A1 * | 10/2008 | Kususe | H01L 24/06 257/98 |
| 2008/0258156 | A1 * | 10/2008 | Hata | H01L 33/20 257/88 |
| 2009/0008661 | A1 * | 1/2009 | Arimitsu | H01L 33/20 257/96 |
| 2009/0085048 | A1 * | 4/2009 | Lee | H01L 27/156 257/89 |
| 2009/0121241 | A1 * | 5/2009 | Keller | H01L 33/58 257/96 |
| 2009/0184329 | A1 | 7/2009 | Miki et al. | |
| 2009/0212318 | A1 * | 8/2009 | Fudeta | H01L 33/32 257/99 |
| 2009/0242910 | A1 * | 10/2009 | Murofushi | H01L 27/15 257/88 |
| 2009/0267085 | A1 * | 10/2009 | Lee | F21K 9/00 257/88 |
| 2010/0032696 | A1 * | 2/2010 | Yu | H01L 33/007 257/96 |
| 2010/0065869 | A1 * | 3/2010 | Arai | H01L 33/0079 257/98 |
| 2010/0096657 | A1 | 4/2010 | Ou et al. | |
| 2010/0237384 | A1 | 9/2010 | Choo et al. | |
| 2011/0018022 | A1 | 1/2011 | Okabe et al. | |
| 2011/0068349 | A1 | 3/2011 | Shinohara et al. | |
| 2011/0089401 | A1 | 4/2011 | Hiraiwa et al. | |
| 2011/0114984 | A1 * | 5/2011 | Seong | H01L 21/76254 257/98 |
| 2011/0140100 | A1 | 6/2011 | Takata et al. | |
| 2011/0140135 | A1 * | 6/2011 | Lee | F21K 9/00 257/88 |
| 2011/0198567 | A1 * | 8/2011 | Shinohara | H01L 33/025 257/13 |
| 2011/0266568 | A1 | 11/2011 | Aldaz et al. | |
| 2011/0284903 | A1 * | 11/2011 | Loh | H01L 33/486 257/98 |
| 2012/0113658 | A1 | 5/2012 | Sakai | |
| 2012/0138999 | A1 * | 6/2012 | Okabe | H01L 33/405 257/98 |
| 2012/0199861 | A1 | 8/2012 | Tsuji | |
| 2012/0235204 | A1 * | 9/2012 | Hodota | H01L 33/38 257/98 |
| 2012/0305889 | A1 | 12/2012 | Lim et al. | |
| 2013/0026525 | A1 * | 1/2013 | Chen | H01L 33/62 257/98 |
| 2013/0056785 | A1 | 3/2013 | Hwang | |
| 2013/0069095 | A1 * | 3/2013 | Hodota | H01L 33/42 257/98 |
| 2013/0119420 | A1 | 5/2013 | Choi et al. | |
| 2013/0119424 | A1 * | 5/2013 | Kang | H01L 33/20 257/98 |

(56) References Cited

U.S. PATENT DOCUMENTS

| | | | |
|---|---|---|---|
| 2013/0126919 A1* | 5/2013 | Yamasaki | H01L 33/38 |
| | | | 257/94 |
| 2013/0181239 A1* | 7/2013 | Lee | H01L 33/08 |
| | | | 257/88 |
| 2013/0299858 A1 | 11/2013 | Kar et al. | |
| 2013/0341661 A1* | 12/2013 | Higashino | H01L 33/60 |
| | | | 257/98 |
| 2014/0124807 A1* | 5/2014 | Kuo | H01L 33/405 |
| | | | 257/98 |
| 2014/0183588 A1* | 7/2014 | Tokunaga | H01L 33/0079 |
| | | | 257/98 |
| 2014/0377895 A1* | 12/2014 | Seong | H01L 33/0079 |
| | | | 438/27 |
| 2015/0060895 A1* | 3/2015 | Zeng | H01L 25/0753 |
| | | | 257/88 |
| 2016/0172557 A1* | 6/2016 | Kuo | H01L 33/08 |
| | | | 257/98 |

FOREIGN PATENT DOCUMENTS

| | | |
|---|---|---|
| CN | 101123291 A | 2/2008 |
| CN | 101971368 A | 2/2011 |
| CN | 102484185 A | 5/2012 |

* cited by examiner

LIGHT EMITTING DEVICE

REFERENCE TO RELATED APPLICATION

This application is a continuation application of U.S. patent application Ser. No. 15/854,462, filed on Dec. 26, 2017, which is a continuation application of U.S. patent application Ser. No. 15/357,334, filed on Nov. 21, 2016, now issued, which is a continuation application of U.S. patent application Ser. No. 15/049,917, filed on Feb. 22, 2016, now issued, which is a continuation application of U.S. patent application Ser. No. 13/854,212, filed on Apr. 1, 2013, now issued, which claims the right of priority based on U.S. Provisional Application No. 61/721,737, filed on Nov. 2, 2012 and the contents of which are hereby incorporated by references in their entireties.

TECHNICAL FIELD

The present application relates to a light-emitting device with an excellent electrode structure to improve the reliability thereof.

DESCRIPTION OF BACKGROUND ART

As the light-emitting efficiency is increased and the cost of manufacturing is decreased, the dream for solid lighting device to replace the traditional lighting device may come true in recent years. Currently, the internal light-emitting efficiency of the light-emitting diode is about 50% to 80%, but a part of the light may be absorbed by the electrode or the light-emitting layer so the total light-emitting efficiency is degraded. Therefore, the mirror layer under the electrode has been provided to solve the problem. When the route of the light extracted from the light-emitting layer is blocked by the electrode, the mirror can reflect but not absorbs the light. On the other hand, the electrode has a bonding pad for wire bonding, and the bonding pad is usually made of gold (Au). Since gold (Au) is very expensive, the cost of the electrode is increased.

SUMMARY OF THE DISCLOSURE

A light-emitting device, comprising: a substrate; a semiconductor stacking layer comprising a first type semiconductor layer on the substrate, an active layer on the first semiconductor layer, and a second semiconductor layer on the active layer; and an electrode structure on the second semiconductor layer, wherein the electrode structure comprises a bonding layer, a conductive layer, and a first barrier layer between the bonding layer and the conductive layer; wherein the conductive layer has higher standard oxidation potential than that of the bonding layer.

DETAILED DESCRIPTION OF PREFERRED EMBODIMENTS

Figure 1A:
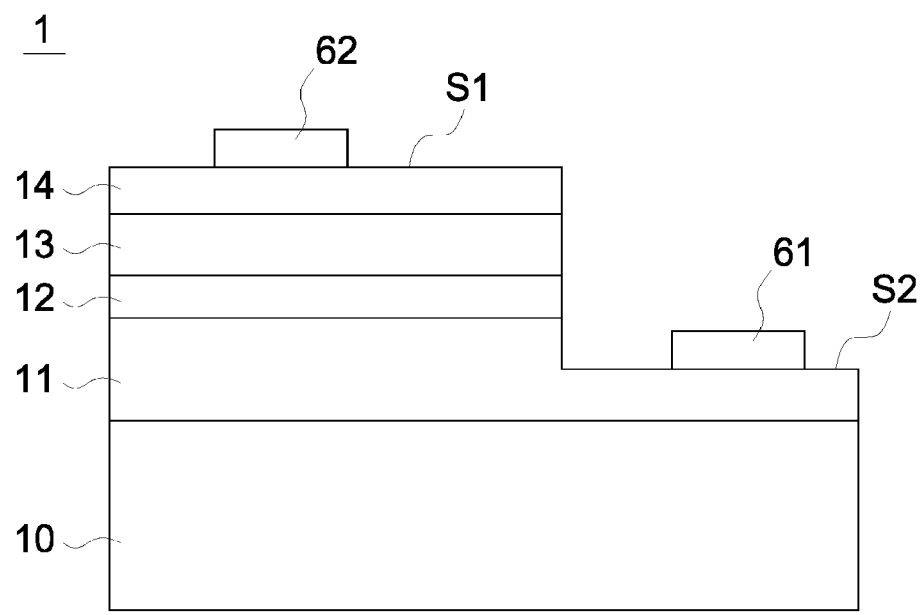
FIGS. 1A and 1B show a light-emitting device in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIG. 1A shows a light-emitting device 1 comprising a substrate 10, a first semiconductor layer 11 having a first polarity, such as an n-type GaN layer, on the substrate 10, an active layer 12 having a structure, such as InGaN-based multiple-quantum-well (MQW) structure, on the first semiconductor layer 11, a second semiconductor layer 13 having a second polarity, such as a p-type GaN layer, on the active layer 12, a transparent conductive oxide layer 14 comprising a first metal material, such as indium tin oxide (ITO), on the second semiconductor layer 13, a top surface S2 of the first semiconductor layer 11 revealed from the active layer 12 and the second semiconductor layer 13, a first electrode structure 61 on the top surface S2, and a second electrode structure 62 on a top surface 51 of the transparent conductive oxide layer 14.

Figure 1B:
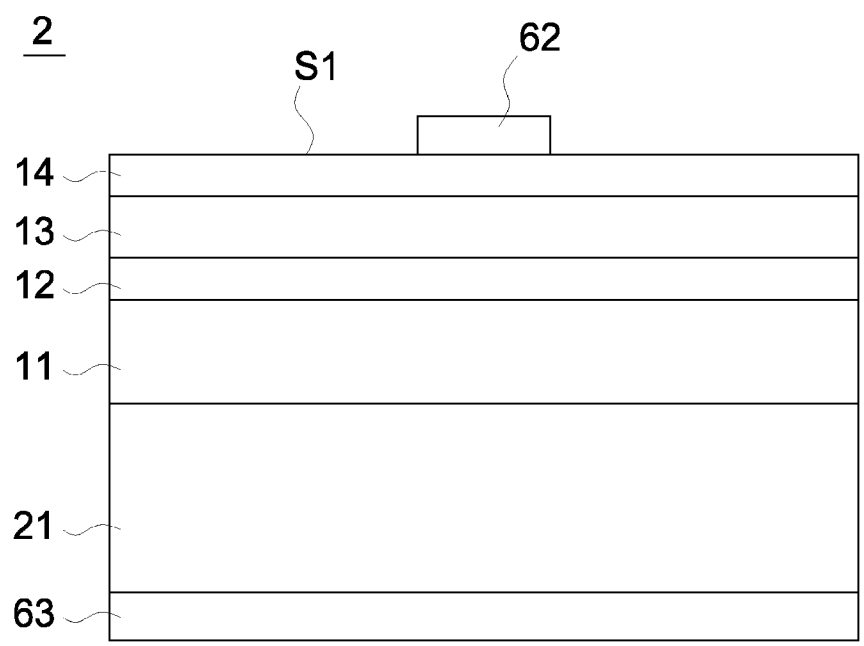

The substrate 10 can be an insulating substrate, such as sapphire. In another embodiment, a vertical-type light-emitting device 2 is also disclosed in FIG. 1B by arranging a third electrode structure 63 and the second electrode structure 62 on opposite sides of a conductive substrate 21. The conductive substrate 21 comprises a conductive material, such as metal, e.g. Cu, Al, In, Sn, Zn, W or the combination thereof, or semiconductor, e.g. Si, SiC, GaN, GaAs, etc.

The material of the first semiconductor layer 11, the active layer 12, and the second semiconductor layer 13 comprise group III-V compound semiconductor, such as gallium phosphide (GaP), gallium arsenide (GaAs), or gallium nitride (GaN). The first semiconductor layer 11, the second semiconductor layer 13, or the active layer 12 may be formed by a known epitaxy method such as metallic-organic chemical vapor deposition (MOCVD) method, a molecular beam epitaxy (MBE) method, or a hydride vapor phase epitaxy (HVPE) method.

The material of the transparent conductive oxide layer 14 comprises transparent conductive oxide material, such as indium tin oxide (ITO), cadmium tin oxide (CTO), antimony tin oxide, indium zinc oxide, zinc aluminum oxide, zinc oxide, and zinc tin oxide. The transparent conductive oxide layer 14 has a predetermined thickness such as smaller than 3000 angstroms and if formed by a evaporation deposition method under chamber conditions of around room temperature, N2 ambient environment, and a pressure between $1 \times 10^{-4}$ Torr and $1 \times 10^{-2}$ Torr, or preferably around $5 \times 10^{-3}$ Torr.

First Embodiment

Figure 2:
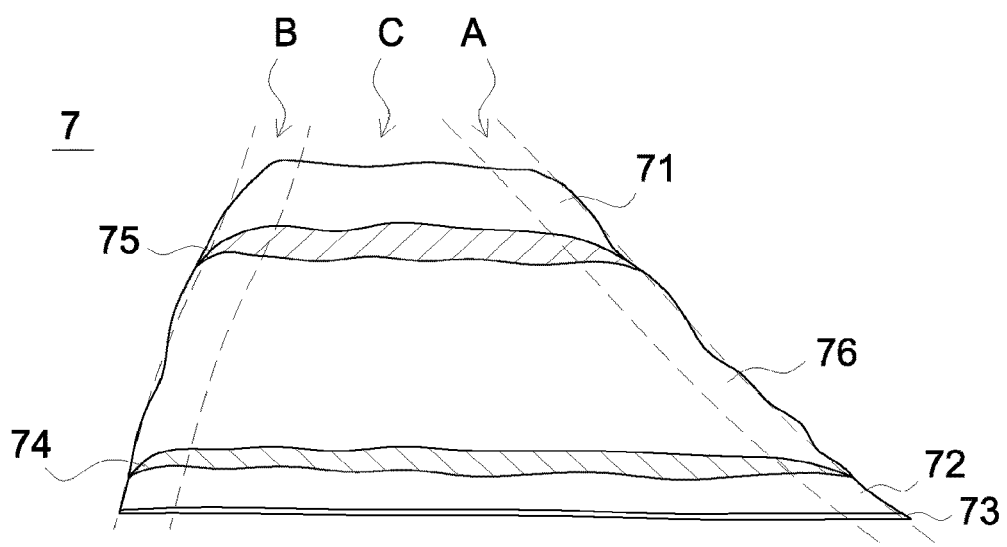
FIG. 2 shows the detailed structure of an electrode structure in accordance with the first embodiment of the present application.

FIG. 2 shows an electrode structure 7 which details the first electrode structure 61, the second electrode structure 62, and the third electrode structure 63 in accordance with the first embodiment. The electrode structure 7 comprises a bonding layer 71 for wire bonding, a conductive layer 76 under the bonding layer 71, a mirror layer 72 under the conductive layer 76 for reflecting the light emitted from the active layer 12, an adhesion layer 73 for increasing the adhesion between the mirror layer 72 and the transparent conductive structure 14 or the first semiconductor layer 11, a second barrier layer 74 between the conductive layer 76 and the mirror layer 72 for separating the conductive layer 76 from directly contacting the mirror layer 72, and a first barrier layer 75 between the bonding layer 71 and the conductive layer 76 for separating the conductive layer 76 from directly contacting the bonding layer 71.

The bonding layer 71 comprises a first metal, e.g. Au. The thickness of the bonding layer 71 is between 1000 Å and 42000 Å, and preferably is between 5000 Å and 10000 Å. The conductive layer 76 comprises a second metal different from the first metal, e.g. Al, Ag, or Cu. The electrical conductivity of the second metal is 0.1~10 times the electrical conductivity of the first metal. The first metal is more chemically stable than the second metal, or the second metal has higher standard oxidation potential than the first metal. The thickness of the conductive layer 76 is 0.1~10 times the thickness of the bonding layer 71. The thickness of the conductive layer 76 depends on the amount of operating current flowing through the electrode structure 7. If the electrical conductivity of the bonding layer 71 is smaller than that of the conductive layer 76 under a low to moderate driving current injected into the electrode structure 7, e.g. 120 mA~300 mA, a first ratio of the thickness of the conductive layer 76 to the total thickness of the electrode structure 7 is between 0.3 and 0.5. The total thickness of the conductive layer 76 and the bonding layer 71 is about 0.4~0.7 times the total thickness of the electrode structure 7. If the electrical conductivity of the bonding layer 71 is smaller than that of the conductive layer 76 under a high driving current injected into the electrode structure 7, e.g. 350 mA~1000 mA, a second ratio of the thickness of the conductive layer 76 to the total thickness of the electrode structure 7, which is greater than the first ratio, is between 0.5 and 0.8. The total thickness of the conductive layer 76 and the bonding layer 71 is about 0.6~0.9 times the total thickness of the electrode structure 7. If the electrical conductivity of the bonding layer 71 is greater than that of the conductive layer 76, when a low to moderate driving current injects into the electrode structure 7, e.g. 120 mA~300 mA, a third ratio of the thickness of the conductive layer 76 to the total thickness of the electrode structure 7 is between 0.4 and 0.7, or the total thickness of the conductive layer 76 and the bonding layer 71 is about 0.5~0.8 times the total thickness of the electrode structure 7. If the electrical conductivity of the bonding layer 71 is greater than that of the conductive layer 76 under a high driving current injected into the electrode structure 7, e.g. 350 mA~1000 mA, a fourth ratio of the thickness of the conductive layer 76 to the total thickness of the electrode structure 7, which is greater than the third ratio, is between 0.55 and 0.85. The total thickness of the conductive layer 76 and the bonding layer 71 is about 0.75~0.95 times the total thickness of the electrode structure 7. The mirror layer 72 comprises metal having a reflectivity greater than 80% to the light emitted from active layer 12, e.g. Al or Ag. The thickness of the mirror layer 72 is preferably between 500 Å and 5000 Å.

The second barrier layer 74 serves to separate the mirror layer 72 from the conductive layer 76 to prevent the conductive layer 76 from inter-diffusing with the mirror layer 72 at the in-between interface and form low contact resistance and good adhesion between the mirror layer 72 and the bonding layer 71. The second barrier layer 74 comprises a third metal layer and a fourth metal layer stacked on the third metal layer, wherein the fourth metal layer comprises a material different from the third metal layer. In another embodiment, the second barrier layer 74 comprises a plurality of the third metal layers and a plurality of fourth metal layers alternately stacked, e.g. Ti/Pt/Ti/Pt or Ti/Pt/Ti/Pt/Ti/Pt. The third metal layer is preferred about one to three times thicker than the fourth metal layer. The thickness of the third metal layer is between 500 Å and 1500 Å and the thickness of the fourth metal layer is between 250 Å and 750 Å. The third metal layer and the fourth metal layer each comprises a material selected from the group consisting of Cr, Pt, Ti, TiW, W, and Zn. Therefore, the second barrier layer 74 comprises at least two materials selected from the group consisting of Cr/Pt, Cr/Ti, Cr/TW, Cr/W, Cr/Zn, Ti/Pt, Ti/W, Ti/TiW, Ti/W, Ti/Zn, Pt/TiW, Pt/W, Pt/Zn, TiW/W, TiW/Zn, and W/Zn. The first barrier layer 75 serves to separate the bonding layer 71 from the conductive layer 76 to prevent the conductive layer 76 from inter-diffusing with the bonding layer 71 at the in-between interface and form low contact resistance and good adhesion between the bonding layer 71 and the conductive layer 76. The first barrier layer 75 comprises a first metal layer and a second metal layer stacked on the first metal layer, wherein the first metal layer comprises a material different from the second metal layer. In another embodiment, the first barrier layer 75 comprises a plurality of the first metal layers and a plurality of second metal layers alternately stacked, e.g. Ti/Pt/Ti/Pt or Ti/Pt/Ti/Pt/Ti/Pt. The first metal layer is preferred about one to three times thicker than the second metal layer. The thickness of the first metal layer is between 500 Å and 1500 Å and the thickness of the second metal layer is between 250 Å and 750 Å. The first metal layer and the second metal layer each comprises a material selected from the group consisting of Cr, Pt, Ti, TiW, W, and Zn. Therefore the first barrier layer 75 comprises at least two materials selected from the group consisting of Cr/Pt, Cr/Ti, Cr/TW, Cr/W, Cr/Zn, Ti/Pt, Ti/W, Ti/TiW, Ti/W, Ti/Zn, Pt/TiW, Pt/W, Pt/Zn, TiW/W, TiW/Zn, and W/Zn. The adhesion layer 73 is used to increase adhesion between the mirror layer 72 and the transparent conductive structure 14 or the first semiconductor layer 11. The adhesion layer 73 preferably comprises Cr or Rh. The thickness of the adhesion layer 73 is preferably between 5 Å and 50 Å such that the adhesion layer 73 is thin enough to be pervious to the light emitted from the active layer 12.

For each of the mirror layer 72, the second barrier layer 74, the conductive layer 76, the first barrier layer 75, and the bonding layer 71, the thickness of each of these layers in an edge region A or B is smaller than that in a center region C. The shape of the electrode structure 7 is approximately a trapezoid, or preferred a non-symmetrical trapezoid with two opposite sides having different slopes.

Second Embodiment

Figure 3A:
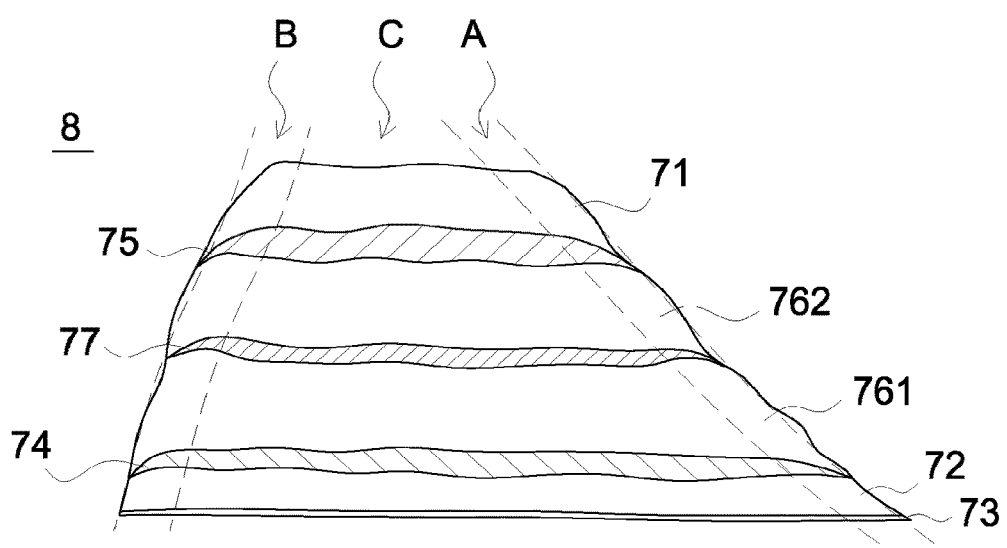
FIGS. 3A and 3B show the detailed structure of an electrode structure in accordance with the second embodiment of the present application.
Figure 3B:
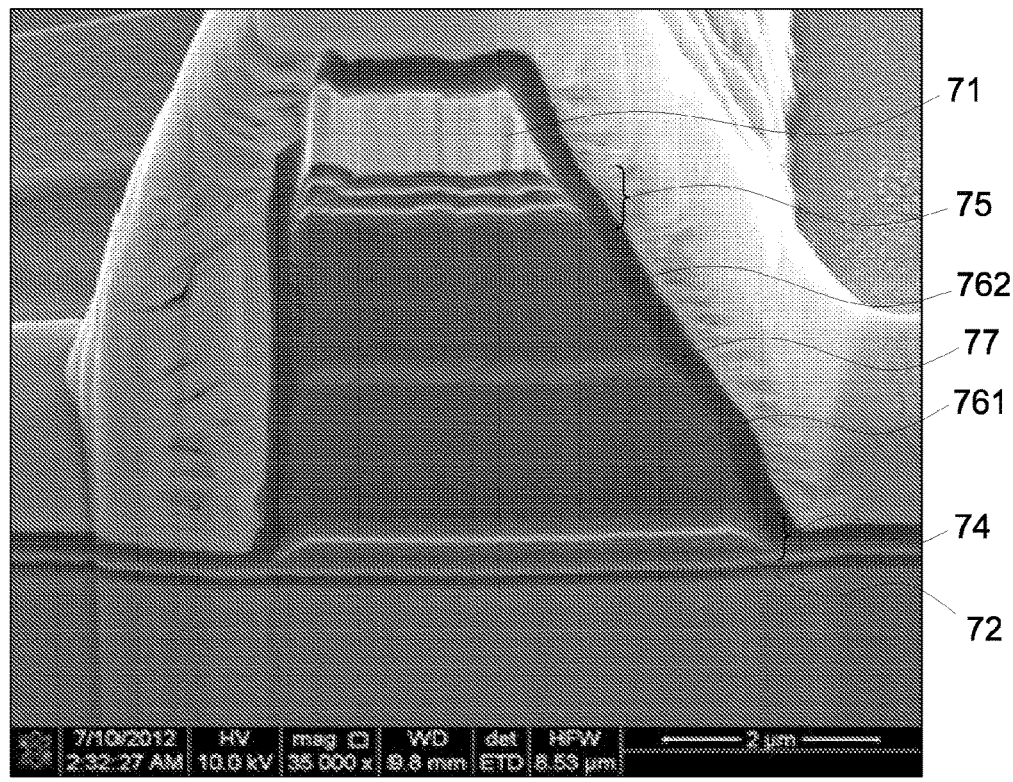

FIG. 3A shows an electrode structure 8 which details the first electrode structure 61, the second electrode structure 62, and the third electrode structure 63 in accordance with the second embodiment. FIG. 3B shows the scanning electron microscope (SEM) figure of the detailed structure of the electrode structure 8. The difference between the electrode structure 8 of FIG. 3A and the electrode structure 7 of FIG. 2 is that the conductive layer 76 of the electrode structure 7 is divided into two parts, i.e. a first conductive layer 761 and a second conductive layer 762, and a third barrier layer 77 is between the first conductive layer 761 and the second conductive layer 762 to reduce out-diffusing of the first conductive layer 761 and the second conductive layer 762 to the bonding layer 71 or the mirror layer 72 caused by electron migration effect when a high driving current injected into the electrode structure 8. The first conductive layer 761 and the second conductive layer 762 comprise substantially the same material, and the thickness of the first conductive layer 761 is about equal to or of the same order as that of the second conductive layer 762. The third barrier layer 77 comprises a material different from the material of the first conductive layer 761 or the second conductive layer 762. The third barrier layer 77 comprises a single metal layer selected from the group consisting of Cr, Pt, Ti, TiW, W, and Zn. The thickness of the single metal layer is between 500 Å and 1500 Å.

For each of the mirror layer 72, the second barrier layer 74, the first conductive layer 761, the third barrier layer 77, the second conductive layer 762, the first barrier layer 75, and the bonding layer 71, the thickness of each of these layers in an edge region A or B is smaller than that in a center region C. The shape of the electrode structure 8 is approximately a trapezoid, or preferred a non-symmetrical trapezoid with two opposite sides having different slopes.

Third Embodiment

Figure 4:
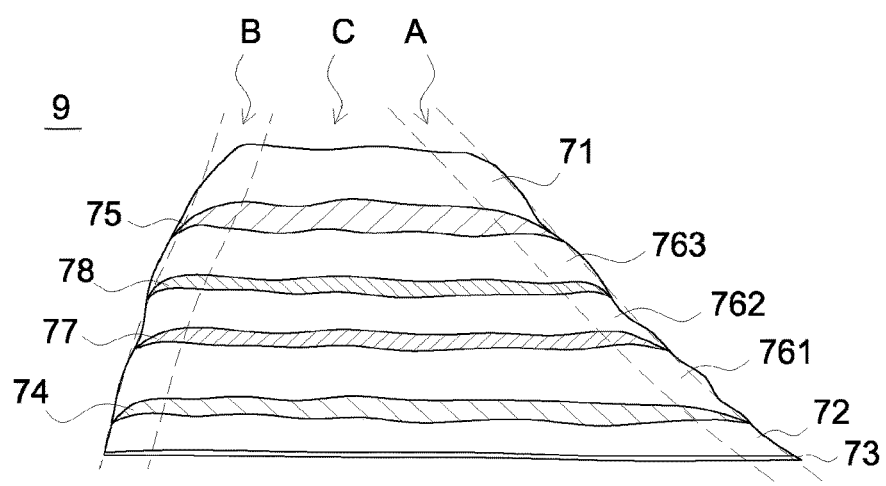
FIG. 4 shows the detailed structure of an electrode structure in accordance with the third embodiment of the present application.

FIG. 4 shows an electrode structure 9 which details the first electrode structure 61, the second electrode structure 62, and the third electrode structure 63 in accordance with the third embodiment. The difference between the electrode structure 9 of FIG. 4 and the electrode structure 7 of FIG. 2 is that the conductive layer 76 of the electrode structure 7 is divided into three parts, i.e. the first conductive layer 761, the second conductive layer 762 and a third conductive layer 763, and the second conductive layer 762 and the third conductive layer 763 is separated by a fourth barrier layer 78. The thicknesses of the first conductive layer 761, the second conductive layer 762 and the third conductive layer 763 are about equal, or of the same order. The fourth barrier layer 78 comprises the same material as the third barrier layer 77.

For each of the mirror layer 72, the second barrier layer 74, the first conductive layer 761, the third barrier layer 77, the second conductive layer 762, the fourth barrier layer 78, the third conductive layer 763, the first barrier layer 75, and the bonding layer 71, the thickness of each of these layers in an edge region A or B is smaller than that in a center region C, and each of these layers in the edge region A or B is bended downward toward the active layer 12. The shape of the electrode structure 9 is approximately a symmetrical trapezoid, or preferred a non-symmetrical trapezoid with two opposite sides having different slopes.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a first semiconductor layer;
   an active layer on the first semiconductor layer;
   a second semiconductor layer on the active layer; and
   an electrode structure on the second semiconductor layer,
   wherein the electrode structure comprises a plurality of conductive layers on the second semiconductor layer, a bonding layer on the plurality of conductive layers, and a first barrier layer between the bonding layer and the plurality of conductive layers,
   wherein the plurality of conductive layers comprises a first conductive layer and a second conductive layer, a thickness of the first conductive layer and a thickness of the second conductive layer are of the same order, and
   wherein the bonding layer comprises a first metal, the plurality of conductive layer comprises a second metal, and the second metal has higher standard oxidation potential than the first metal.

2. A light-emitting device according to claim 1, wherein the electrode structure further comprises an adhesion layer between the second semiconductor layer and the plurality of conductive layers.

3. A light-emitting device according to claim 2, wherein the adhesion layer comprises Cr or Rh.

4. A light-emitting device according to claim 3, wherein the adhesion layer comprises a thickness between 5 Å and 50 Å.

5. A light-emitting device according to claim 1, further comprising a mirror layer between the second semiconductor layer and the plurality of conductive layers, wherein the mirror layer comprises Al or Ag.

6. A light-emitting device according to claim 5, wherein the mirror layer comprises a thickness between 500 Å and 5000 Å.

7. A light-emitting device according to claim 1, wherein the first metal comprises Au, and the second metal comprises Al, Ag or Cu.

8. A light-emitting device according to claim 1, wherein the first barrier layer comprises a third metal layer and a fourth metal layer.

9. A light-emitting device according to claim 8, wherein the third metal layer is one to three times thicker than the fourth metal layer.

10. A light-emitting device according to claim 8, wherein, the third metal layer or the fourth metal layer comprises a material selected from a group consisting of Cr, Pt, Ti, TiW, W, and Zn.

11. A light-emitting device according to claim 5, further comprising a second barrier layer between the mirror layer and the plurality of conductive layers.

12. A light-emitting device according to claim 11, wherein the second barrier layer comprises a fifth metal layer and a sixth metal layer, and the fifth metal layer or the sixth metal layer comprises a material selected from a group consisting of Cr, Pt, Ti, TiW, W, and Zn.

13. A light-emitting device according to claim 1, further comprising a third barrier layer between the first conductive layer and the second conductive layer.

14. A light-emitting device according to claim 13, wherein the plurality of conductive layers comprises a third conductive layer and a fourth barrier layer between the second conductive layer and the third conductive layer.

15. A light-emitting device according to claim 14, wherein the third barrier layer and the fourth barrier layer comprise a same material.

16. A light-emitting device according to claim 15, wherein the third barrier layer and the fourth barrier layer comprises a material selected from a group consisting of Cr, Pt, Ti, TiW, W, and Zn.

17. A light-emitting device according to claim 14, wherein each of the third barrier layer and the fourth barrier layer is a single metal layer.

18. A light-emitting device according to claim 14, wherein the single metal layer comprises a thickness between 500 Å and 1500 Å.

19. A light-emitting device according to claim 1, wherein the electrode structure comprises a center region and an edge region, each of the plurality of conductive layers, the third barrier layer and fourth barrier layer in the edge region comprises a thickness smaller than that in the center region.

20. A light-emitting device according to claim 1, wherein the electrode structure comprises a center region and an edge region, each of the plurality of conductive layers, the third barrier layer and fourth barrier layer in the edge region is bended downward toward the active layer.

* * * * *